US009548328B2

(12) United States Patent
Hasegawa et al.

(10) Patent No.: US 9,548,328 B2
(45) Date of Patent: Jan. 17, 2017

(54) SOLID-STATE IMAGE SENSOR AND CAMERA

(71) Applicant: CANON KABUSHIKI KAISHA, Tokyo (JP)

(72) Inventors: Toshinori Hasegawa, Yokohama (JP); Ginjiro Toyoguchi, Tokyo (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/935,794

(22) Filed: Nov. 9, 2015

(65) Prior Publication Data

US 2016/0155774 A1    Jun. 2, 2016

(30) Foreign Application Priority Data

Nov. 27, 2014  (JP) .................. 2014-240366

(51) Int. Cl.
*H01L 27/148* (2006.01)
*H01L 27/146* (2006.01)

(52) U.S. Cl.
CPC ..... *H01L 27/14612* (2013.01); *H01L 27/1464* (2013.01); *H01L 27/14614* (2013.01); *H01L 27/14621* (2013.01); *H01L 27/14623* (2013.01); *H01L 27/14638* (2013.01); *H01L 27/14641* (2013.01)

(58) Field of Classification Search
CPC ............ H01L 27/14818; H01L 27/14612; H01L 27/14614; H01L 27/14621; H01L 27/14638; H01L 27/1464; H01L 27/14641; H03F 3/082

USPC ......................................... 257/231
See application file for complete search history.

(56) References Cited

U.S. PATENT DOCUMENTS

| 5,227,834 A * | 7/1993 | Ishida ............... G02B 7/34 348/229.1 |
| 7,462,810 B2 | 12/2008 | Kobayashi et al. |
| 7,928,477 B2 | 4/2011 | Kobayashi et al. |
| 7,935,995 B2 | 5/2011 | Watanabe et al. |
| 8,045,034 B2 | 10/2011 | Shibata et al. |
| 8,063,351 B2 | 11/2011 | Kobayashi et al. |
| 8,174,604 B2 | 5/2012 | Shibata et al. |
| 8,222,682 B2 | 7/2012 | Watanabe et al. |
| 8,259,206 B1 | 9/2012 | Shibata et al. |
| 8,289,432 B2 | 10/2012 | Shibata et al. |
| 8,357,956 B2 | 1/2013 | Kobayashi et al. |

(Continued)

FOREIGN PATENT DOCUMENTS

| JP | 2010-283232 A | 12/2010 |
| JP | 2013-098446 A | 5/2013 |

*Primary Examiner* — Tu-Tu Ho
(74) *Attorney, Agent, or Firm* — Fitzpatrick, Cella, Harper & Scinto

(57) ABSTRACT

A solid-state image sensor is provided. The sensor includes a substrate having a light-receiving surface. The substrate includes a charge accumulation portion that forms part of a photoelectric conversion element, a charge holding portion arranged at a position deeper than the charge accumulation portion from the light-receiving surface, and a first transfer portion configured to transfer charges generated by the photoelectric conversion element to the charge holding portion along a depth direction of the substrate. A distance between the charge holding portion and the light-receiving surface is not less than 4 μm.

26 Claims, 6 Drawing Sheets

(56) References Cited

U.S. PATENT DOCUMENTS

| | | |
|---|---|---|
| 8,456,555 B2 | 6/2013 | Um et al. |
| 8,519,455 B2 * | 8/2013 | Chiang .................. B82Y 10/00 |
| | | 257/290 |
| 8,552,353 B2 | 10/2013 | Kobayashi et al. |
| 8,723,232 B2 | 5/2014 | Kobayashi et al. |
| 8,884,391 B2 | 11/2014 | Fudaba et al. |
| 8,921,900 B2 | 12/2014 | Iida et al. |
| 9,124,833 B2 | 9/2015 | Toyoguchi et al. |
| 9,147,708 B2 | 9/2015 | Okita et al. |
| 9,153,610 B2 | 10/2015 | Kobayashi et al. |
| 2001/0048124 A1 * | 12/2001 | Okamoto .......... H01L 27/14812 |
| | | 257/291 |
| 2005/0212940 A1 * | 9/2005 | Kobayashi ............. H04N 9/045 |
| | | 348/316 |
| 2007/0052056 A1 * | 3/2007 | Doi .................... H01L 27/1463 |
| | | 257/462 |
| 2012/0199882 A1 * | 8/2012 | Shin ................. H01L 27/14607 |
| | | 257/222 |
| 2013/0187210 A1 | 7/2013 | Kobayashi et al. |
| 2014/0061436 A1 | 3/2014 | Kobayashi |
| 2015/0222836 A1 | 8/2015 | Wada et al. |
| 2015/0264283 A1 | 9/2015 | Kobayashi et al. |
| 2015/0264287 A1 | 9/2015 | Shimotsusa et al. |
| 2015/0281614 A1 | 10/2015 | Yoshida et al. |
| 2015/0341579 A1 | 11/2015 | Kobayashi et al. |
| 2015/0357358 A1 | 12/2015 | Okita et al. |

\* cited by examiner

FIG. 10

| WAVELENGTH [nm] | SILICON ABSORPTION DEPTH [μm] | ENERGY [eV] |
|---|---|---|
| 400 | 0.11 | 3.10 |
| 450 | 0.39 | 2.76 |
| 500 | 0.90 | 2.48 |
| 550 | 1.56 | 2.26 |
| 600 | 2.42 | 2.07 |
| 650 | 3.56 | 1.91 |
| 660 | 3.88 | 1.88 |
| 700 | 5.26 | 1.77 |
| 750 | 7.69 | 1.65 |
| 800 | 11.76 | 1.55 |

SOLID-STATE IMAGE SENSOR AND CAMERA

BACKGROUND OF THE INVENTION

Field of the Invention

The present invention relates to a solid-state image sensor and a camera.

Description of the Related Art

There is known a solid-state image sensor that provides a charge holding portion in each pixel and thus allows all pixels to simultaneously transfer signal charges generated in photoelectric conversion portions to the charge holding portions. In the solid-state image sensor having this function, when light from outside enters the charge holding portion that is holding signal charges, charges newly generated by photoelectric conversion in the charge holding portion produce noise. Japanese Patent Laid-Open No. 2013-98446 describes a solid-state image sensor in which a light-shielding layer is provided in a semiconductor substrate. This aims at suppressing charge generation in the charge holding portion and suppressing degradation of image quality.

SUMMARY OF THE INVENTION

The present inventors found that light-shielding performance for the charge holding portion is insufficient in the structure of Japanese Patent Laid-Open No. 2013-98446. For this reason, charges are generated in the charge holding portion to cause noise, and as a result, image quality degrades. Some embodiments of the present invention provide a technique of suppressing degradation of image quality caused by incident light from the outside of a solid-state image sensor.

According to some embodiments, a solid-state image sensor is provided. The solid-state image sensor according to the embodiments includes a substrate having a light-receiving surface; a charge accumulation portion that forms part of a photoelectric conversion element; a charge holding portion arranged at a position deeper than the charge accumulation portion from the light-receiving surface; and a first transfer portion configured to transfer charges generated by the photoelectric conversion element to the charge holding portion along a depth direction of the substrate. A distance between the charge holding portion and the light-receiving surface is not less than 4 μm.

According to some other embodiments, a camera including: a solid-state image sensor; and a signal processing unit configured to process a signal obtained by the solid-state image sensor is provided. The sensor according to the embodiments includes a substrate having a light-receiving surface; a charge accumulation portion that forms part of a photoelectric conversion element; a charge holding portion arranged at a position deeper than the charge accumulation portion from the light-receiving surface; and a first transfer portion configured to transfer charges generated by the photoelectric conversion element to the charge holding portion along a depth direction of the substrate. A distance between the charge holding portion and the light-receiving surface is not less than 4 μm.

Further features of the present invention will become apparent from the following description of exemplary embodiments (with reference to the attached drawings).

BRIEF DESCRIPTION OF THE DRAWINGS

FIG. 10 is a relationship between the wavelength of light and a silicon absorption depth where the intensity of incident light becomes 1/e.

DESCRIPTION OF THE EMBODIMENTS

Figure 1:
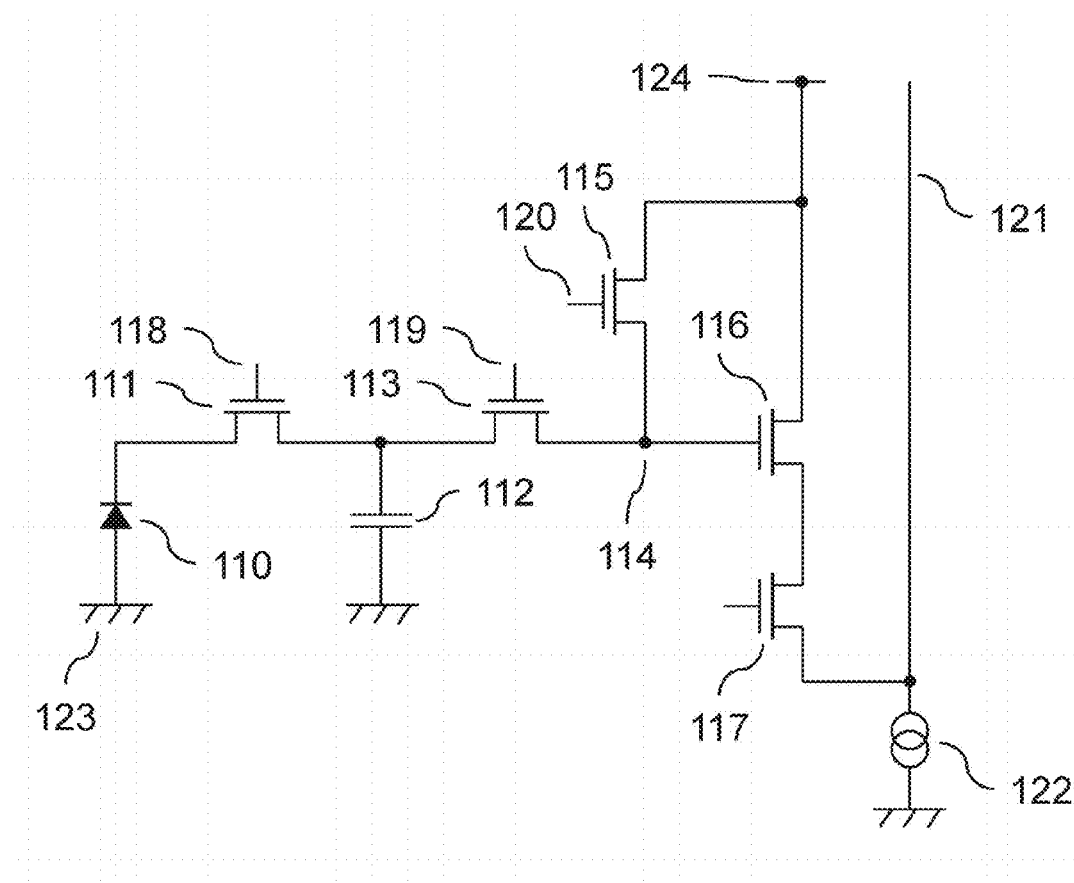
FIG. 1 is an equivalent circuit of a solid-state image sensor according to an embodiment of the present invention.

Detailed embodiments of a solid-state image sensor according to the present invention will now be described with reference to the accompanying drawings. Note that in the following explanation and drawings, the same reference numerals denote the same parts throughout a plurality of drawings. Hence, the same parts will be described by cross-referring the plurality of drawings, and a description of parts with the same reference numerals will appropriately be omitted.

FIG. 1 shows an example of an equivalent circuit of one pixel of a solid-state image sensor according to an embodiment. As a photoelectric conversion portion 110, for example, a photodiode is used. Electrons are used as signal charges. A first transfer portion 111 transfers signal charges generated by the photoelectric conversion portion 110 to a charge holding portion 112. As the first transfer portion 111, for example, an NMOS transistor is used. The charge holding portion 112 includes a capacitor for temporarily accumulating the signal charges generated by the photoelectric conversion portion 110 and transferred by the first transfer portion 111. A second transfer portion 113 transfers the signal charges temporarily accumulated in the charge holding portion 112 to a charge detection unit 114 that constitutes the input node of a signal amplification unit. A reset transistor 115 sets the potential of the charge detection unit 114 to a reference potential. As the reset transistor 115, for example, an NMOS transistor is used. A signal amplification transistor 116 forms a signal amplification unit that amplifies a signal based on the potential of the charge detection unit 114 and outputs the signal. As the signal amplification transistor 116, for example, an NMOS transistor is used. The charge detection unit 114 and the gate electrode of the signal amplification transistor 116 are electrically connected. Control electrodes 118, 119, and 120 are electrodes that control the operations of the first transfer portion 111, the second transfer portion 113, and the reset transistor 115, respectively. Driving pulses from a vertical scanning circuit (not shown) are supplied to these control electrodes to control the transistors. Signals amplified by a plurality of signal amplification transistors 116 included in a pixel column are selected by a selection transistor 117 and sequentially output to a vertical output line 121. A current source 122 supplies a bias current to the signal amplification transistor 116. In this circuit arrangement, the current source 122 supplies a bias current to cause the signal amplification transistor 116 to operate as a source follower.

A ground potential 123 is supplied from a ground potential supply line (not shown) to the photoelectric conversion portion 110, the charge holding portion 112, and the transistors via a well and a contact plug or the like. A power supply 124 supplies power to the drains of the reset transistor 115 and the signal amplification transistor 116. In this circuit arrangement, a common power supply is used. However, separate power supplies may be used.

FIG. 1 illustrates only one pixel. However, the pixel circuit may partially be shared by a plurality of pixels. For example, the reset transistor 115 may be shared by a plurality of pixels. In addition, for example, holes may be used as signal charges. In this case, PMOS transistors may be used as, for example, the first transfer portion 111, the second transfer portion 113, the reset transistor 115, the signal amplification transistor 116, and the like. Without using the second transfer portion 113, the node between the charge holding portion 112 and the first transfer portion may be connected to the gate electrode of the signal amplification transistor 116.

Figure 2:
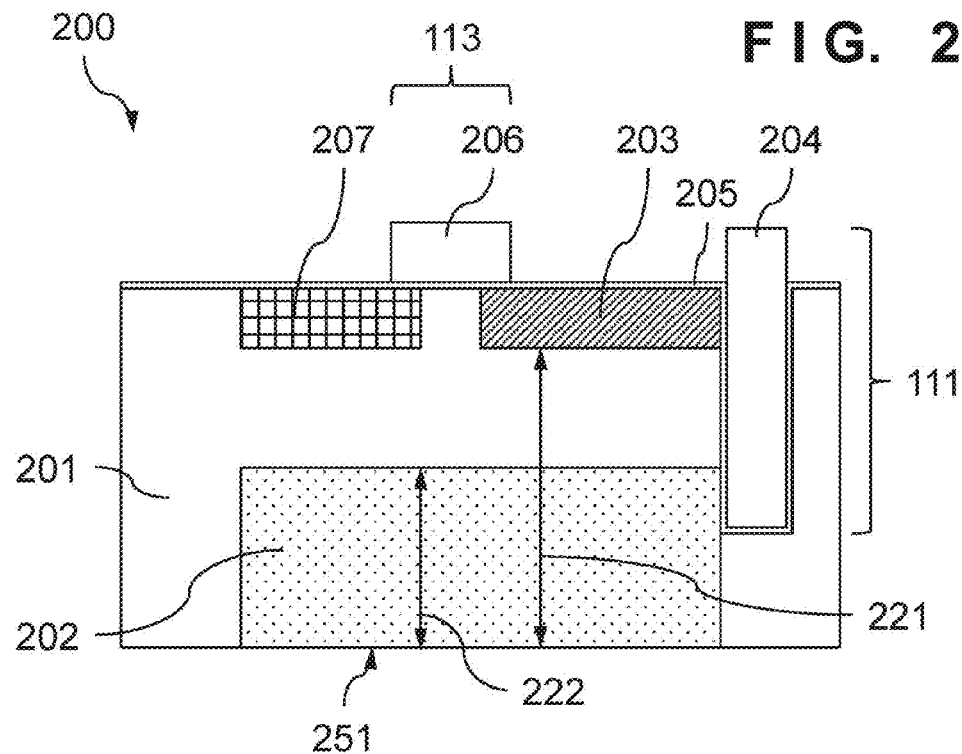
FIG. 2 is a sectional view of the solid-state image sensor according to the embodiment of the present invention.

The structure of a solid-state image sensor according to the embodiment of the present invention will be described with reference to FIGS. 2 to 5 and 10. FIG. 2 is a sectional view schematically showing an example of the arrangement of one pixel of a solid-state image sensor 200 according to a first embodiment of the present invention. The solid-state image sensor 200 includes a charge accumulation portion 202, a charge holding portion 203, and a charge detection unit 207 in a substrate 201. The charge holding portion 203 corresponds to the charge holding portion 112 shown in FIG. 1. The charge detection unit 207 corresponds to the charge detection unit 114 that constitutes the input node of the signal amplification unit. As the substrate 201, a semiconductor substrate such as a silicon substrate is used. As the conductivity type of the substrate 201, for example, a p-type is used. The thickness of the substrate 201 is, for example, 10 μm to 15 μm. In this case, the conductivity type of the charge accumulation portion 202, the charge holding portion 203, and the charge detection unit 207 is opposite to that of the substrate 201, that is, an n-type. The present invention is not limited to this embodiment. For example, the substrate 201 may be of an n-type, and the charge accumulation portion 202, the charge holding portion 203, and the charge detection unit 207 may be of a p-type.

The charge accumulation portion 202 is arranged on the side of a light-receiving surface 251 of the substrate 201. The light-receiving surface 251 means a surface where light from outside enters of the surface of the substrate 201. In addition, "the charge accumulation portion 202 is arranged on the side of the light-receiving surface 251 of the substrate 201" means that the distance between the charge accumulation portion 202 and the light-receiving surface 251 is shorter than the distance between the charge accumulation portion 202 and the surface opposite to the light-receiving surface 251. In this embodiment, the charge accumulation portion 202 is an n-type impurity region formed by implantation, for example, phosphorus or arsenic into the p-type substrate 201. The substrate 201 and the charge accumulation portion 202 form a p-n junction. A p-n photodiode serving as a photoelectric conversion element is thus formed to generate signal charges according to incident light. The p-n photodiode corresponds to the photoelectric conversion portion 110 shown in FIG. 1. A p-type impurity layer (not shown) whose conductivity type is opposite to that of the charge accumulation portion 202 may be provided on the light-receiving surface 251 of the charge accumulation portion 202 and used as a buried photodiode. If the buried photodiode is formed, the charge accumulation portion 202 is isolated from the light-receiving surface 251 of the substrate 201, and generation of a dark current can be suppressed.

The charge holding portion 203 and the charge detection unit 207 are arranged on the far side of the light-receiving surface 251 at a position deeper than the charge accumulation portion 202 in the depth direction of the substrate 201 (that is, the direction away from the light-receiving surface 251). The p-n junction interface of the charge holding portion 203 on the side of the light-receiving surface 251 and the light-receiving surface 251 of the substrate 201 are arranged while being spaced apart by a distance 221. If an insulating film (not shown) or the like is formed on the light-receiving surface 251, the distance 221 is the distance from the interface between the substrate 201 and the insulating film to the p-n junction interface of the charge holding portion 203 on the side of the light-receiving surface 251. The distance 221 may be 4 μm or more. Furthermore, the distance 221 may be 8 μm or more. The p-n junction interface of the charge accumulation portion 202 on the opposite side of the light-receiving surface 251 and the light-receiving surface 251 of the substrate 201 are spaced apart by a distance 222. The distance 221 is longer than the distance 222. The charge holding portion 203 is thus arranged at a position deeper than the charge accumulation portion 202 from the light-receiving surface 251. In this embodiment, the charge accumulation portion 202 is formed from the light-receiving surface 251. For this reason, the depth direction thickness of the charge accumulation portion 202 is the same as the distance 222 and is shorter than the distance 221. As a result, the charge holding portion 203 is arranged at a position deeper than the charge accumulation portion 202 from the light-receiving surface 251.

A first gate electrode 204 that forms the first transfer portion 111 and a second gate electrode 206 that forms the second transfer portion 113 are arranged on the substrate 201. The first gate electrode 204 has a vertical gate structure so as to form the channel of the first transfer portion 111 upon receiving an ON voltage and transfer signal charges from the charge accumulation portion 202 to the charge holding portion 203 in a direction intersecting the light-receiving surface 251 of the substrate 201. In this embodiment, the first gate electrode 204 is arranged such that the channel for transferring signal charges is formed in the vertical direction with respect to the light-receiving surface 251 of the substrate 201. The vertical gate structure of the first gate electrode 204 is formed by forming a gate insulating film 205 in a trench provided in the substrate 201 and then embedding an electrode material such as polysilicon. The second gate electrode 206 that forms the second transfer portion 113 is arranged at a deep position in the substrate 201 with respect to the light-receiving surface 251. The second gate electrode 206 is arranged such that a channel for transferring signal charges from the charge holding portion 203 to the charge detection unit 207 is formed in a direction parallel to the light-receiving surface 251 of the substrate 201. The gate insulating film 205 may be continuous between the first transfer portion 111 and the second transfer portion 113, as shown in FIG. 2, or independently formed for each transfer portion.

When an ON voltage is applied to the first gate electrode 204, the voltage is applied between the charge accumulation portion 202 and the charge holding portion 203 via the gate insulating film 205, and a channel is formed. Signal charges generated in the charge accumulation portion 202 are transferred to the charge holding portion 203 via the channel and temporarily accumulated and held. Next, when an ON voltage is applied to the second gate electrode 206, the voltage is applied between the charge holding portion 203 and the charge detection unit 207 via the gate insulating film 205, and a channel is formed. The signal charges temporarily held in the charge holding portion 203 are transferred to the charge detection unit 207 via the channel. The charges transferred to the charge detection unit 207 are output to a signal processing circuit (not shown) via a signal amplification unit (not shown). The solid-state image sensor 200 performs readout of signal charges from the charge accumulation portion 202 to the charge holding portion 203 simultaneously in all pixels in the image sensing region. Signal charges accumulated in the charge holding portion 203 are temporarily held until they are transferred to the charge detection unit 207 by sequential scanning the pixel array. The solid-state image sensor 200 thus has a global shutter function.

The effect of this embodiment will be described next. In a solid-state image sensor including the charge holding portion 203 that temporarily accumulates and holds signal charges that have been transferred to it, when light from outside enters the charge holding portion 203, charges are newly generated by photoelectric conversion in the charge holding portion 203. If the charges generated in the charge holding portion 203 are superimposed on the signal charges, noise or a pseudo signal is generated, resulting in degradation of image quality. To suppress the influence of light from outside, a solid-state image sensor including a light-shielding layer provided around the charge holding portion, as described in Japanese Patent Laid-Open No. 2013-98446, is used. However, if the light-shielding layer configured to suppress the influence of light from outside is simply provided in the substrate, it is difficult to sufficiently suppress the influence of light.

Meanwhile, in the solid-state image sensor 200 according to this embodiment, the charge holding portion 203 is arranged while being spaced apart from the light-receiving surface 251 of the substrate by the distance 221. FIG. 10 shows the relationship between the wavelength of incident light and a silicon absorption depth where the intensity of incident light becomes 1/e, obtained from the light absorption coefficient of silicon. As is apparent from FIG. 10, the light absorption depth in silicon changes depending on the wavelength, and light having a shorter wavelength is absorbed much in a shallower region, that is, a region closer to the light-receiving surface 251. When the charge holding portion 203 is spaced apart from the light-receiving surface 251 by the distance 221, most light is absorbed by the substrate 201. This can suppress the influence of incident light on the charge holding portion 203. For example, when the distance 221 is 4 µm, most light having a wavelength shorter than 650 nm is absorbed by the substrate 201. If the distance 221 is 8 µm, most light having a wavelength shorter than 750 nm is absorbed by the substrate 201. This makes it possible to ensure light-shielding performance and suppress the influence of light from outside on the charge holding portion 203. As shown in FIG. 10, short-wavelength light has higher energy than long-wavelength light. If the charge holding portion 203 is spaced apart from the light-receiving surface 251, reaching of light with high energy at the charge holding portion 203 can be suppressed. It is possible to reduce generation of noise or a pseudo signal when light enters the charge holding portion 203 in which signal charges are temporarily accumulated, and charges are accordingly generated in the charge holding portion 203. As a result, degradation of image quality is suppressed.

The distance 221 is set in accordance with the wavelength band of light to be acquired by the solid-state image sensor 200. The distance 221 is set such that the charge holding portion 203 is arranged in a region deeper than a region where the longest wavelength of the wavelength band to be acquired by the solid-state image sensor is absorbed by the substrate 201.

Figure 3:
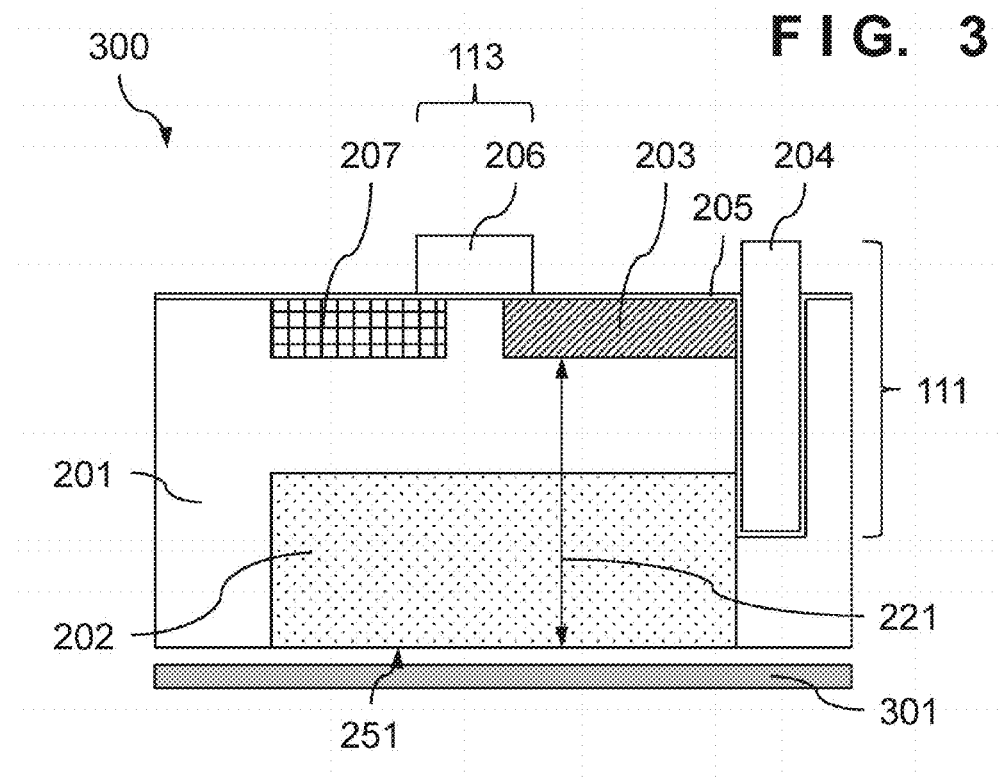
FIG. 3 is a sectional view showing a modification in which an optical filter is added to the solid-state image sensor shown in FIG. 2.

As in a solid-state image sensor 300 shown in FIG. 3, an optical filter 301 may be arranged on the side of the light-receiving surface 251 in the solid-state image sensor 300 so as to cover the charge accumulation portion 202. The optical filter 301 passes or blocks light in a specific wavelength band. As the optical filter 301, an infrared cut filter, a bandpass filter, or the like can appropriately be selected in consideration of the wavelength band of light to be acquired by the solid-state image sensor 300. For example, by using an infrared cut filter for cutting long-wavelength light that enters a deep region of the substrate 201, the influence of incident light on the charge holding portion 203 can be suppressed.

Figure 4:
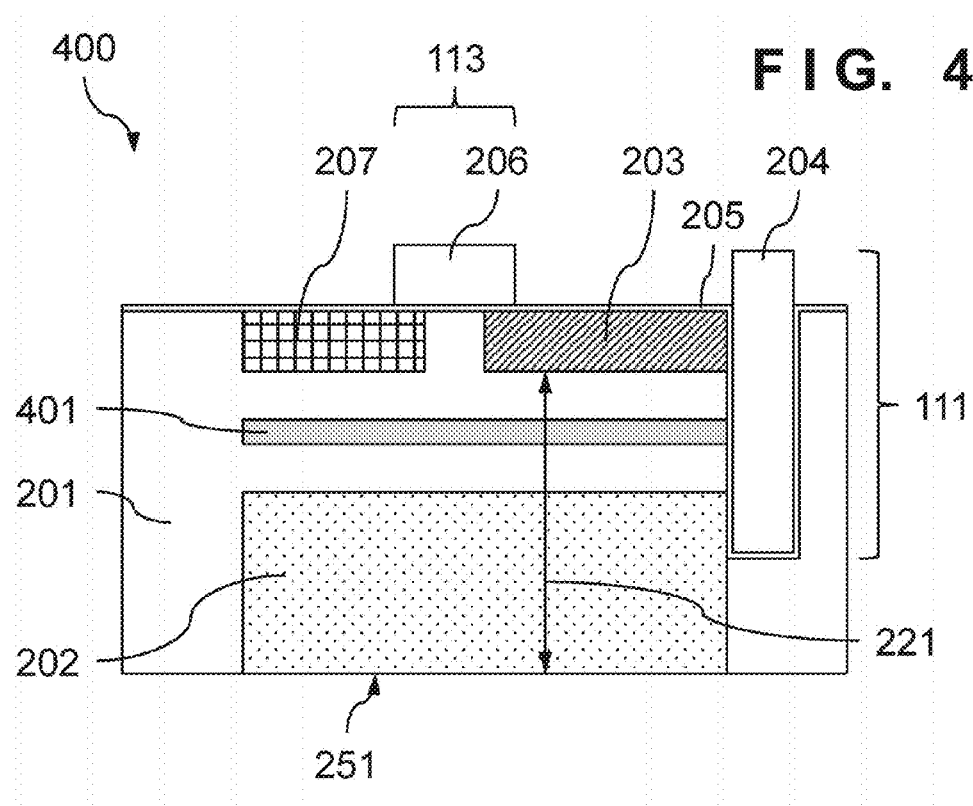
FIG. 4 is a sectional view showing a modification in which a light-shielding layer is added to the solid-state image sensor shown in FIG. 2.
Figure 5:
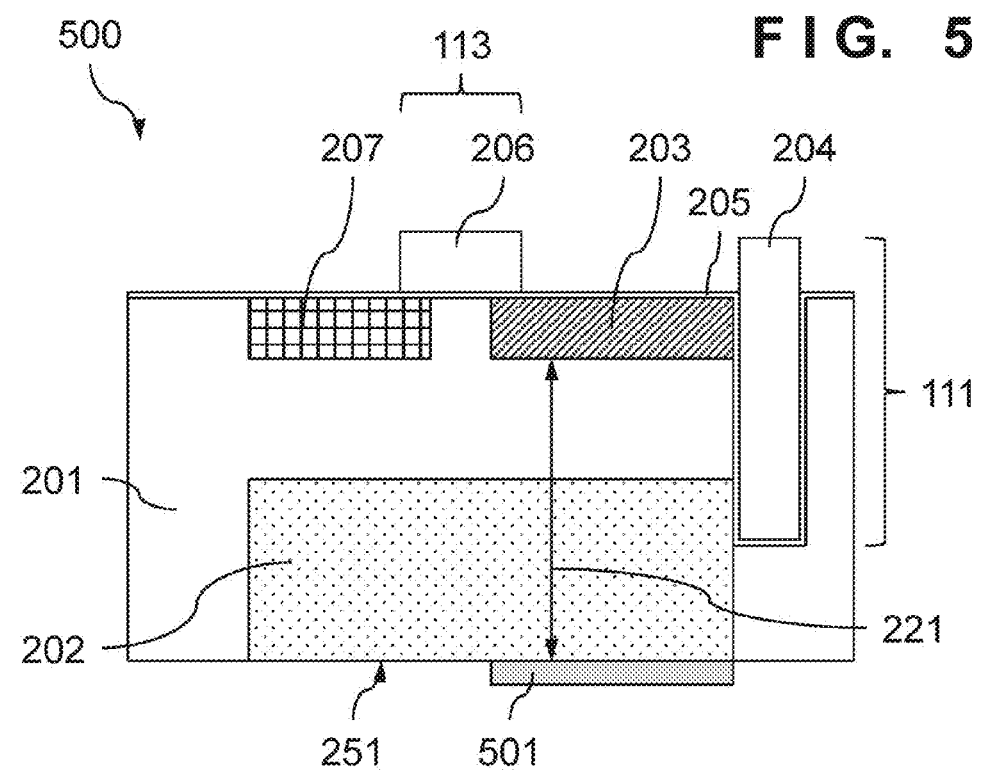
FIG. 5 is a sectional view showing a modification in which a light-shielding layer is added to the solid-state image sensor shown in FIG. 2.

As in solid-state image sensors 400 and 500 shown in FIGS. 4 and 5, a light-shielding layer 401 or 501 may be arranged at a position overlapping the charge holding portion 203 in a planar view of the light-receiving surface 251 of the substrate 201 to prevent light from entering the charge holding portion 203. The light-shielding layer can be arranged between the charge accumulation portion 202 and the charge holding portion 203 in the substrate 201, like the light-shielding layer 401, or arranged on the light-receiving surface 251 of the substrate 201, like the light-shielding layer 501. This can further suppress noise generated in the charge holding portion 203 due to incidence of light. In the solid-state image sensors 400 and 500 as well, since the charge holding portion 203 is arranged while being spaced apart from the light-receiving surface 251 by the distance 221, most light is absorbed by the substrate 201 before reaching the charge holding portion 203. Hence, the light-shielding layer 401 or 501 may have a simple structure as compared to the structure of the light-shielding layer of Japanese Patent Laid-Open No. 2013-98446. This can suppress a decrease in productivity. As the light-shielding layers 401 and 501, a dielectric material such as silicon nitride, silicon oxide, or silicon oxynitride, a metal material such as aluminum or tungsten, or an organic material such as a resist can appropriately be used.

In the solid-state image sensors 200 to 500 according to this embodiment, using the light absorption characteristic of silicon, the charge holding portion 203 is arranged at a predetermined depth, thereby ensuring light-shielding performance and reducing the influence of light that enters the charge holding portion 203. Therefore, it is possible to suppress noise generation by charges generated due to incidence of light during the time when signal charges are temporarily accumulated in the charge holding portion 203. As a result, a solid-state image sensor having a global shutter function and a high S/N ratio can be implemented.

In the solid-state image sensors 200 to 500, since the charge accumulation portion 202 and the charge holding portion 203 are stacked in the vertical direction with respect to the light-receiving surface 251 of the substrate 201, the area of each pixel can be reduced. Downsizing of the solid-state image sensor can also simultaneously be implemented. In the planar view of the light-receiving surface 251 of the substrate 201, the charge holding portion 203 and the charge detection unit 207 may be arranged at positions overlapping the charge accumulation portion 202. This arrangement can implement further downsizing of the solid-state image sensor.

As an application example of the solid-state image sensor according to this embodiment, a solid-state image sensor for an endoscope will be described here. The solid-state image sensor for an endoscope generally uses enhanced display of a morbid portion by special light observation using light in a specific wavelength band. The spectral reflectance characteristic (absorbance) of hemoglobin in blood changes as its oxygen saturation changes. The change in the spectral reflectance characteristic is particularly conspicuous in a wavelength region of about 650 nm. Hence, in the solid-state image sensor for an endoscope, a subject is irradiated with light having a wavelength of about 650 nm, and a spectral reflectance image is acquired, thereby detecting a change in the oxygen saturation of hemoglobin, that is, a change in the oxygen saturation in blood and discriminating a morbid portion.

If the solid-state image sensor according to this embodiment is applied for such an application purpose, the charge holding portion 203 is arranged at a position where the distance 221 is 4 μm. An optical filter configured to block light with a wavelength of 660 nm or more is provided on the light-receiving surface 251 of the solid-state image sensor. If this arrangement is used, light with a wavelength of 660 nm or more is blocked by the optical filter and does not enter the solid-state image sensor. Light with a wavelength up to 660 nm is converted into signal charges in the charge accumulation portion 202. In addition, light with a wavelength up to 660 nm is almost absorbed by the substrate 201 before reaching the charge holding portion 203.

Accordingly, the solid-state image sensor acquires light with a wavelength up to 660 nm as signal information. In addition, since incidence of light on the charge holding portion 203 can be suppressed, it is possible to suppress generation of noise or a pseudo signal by charges generated in the charge holding portion 203 due to incident light. When the solid-state image sensor according to the present invention is applied, an endoscope that accurately determines a change in the oxygen saturation of hemoglobin can be implemented.

Furthermore, for example, to acquire information in a visible light range (400 to 700 nm) by the solid-state image sensor, the charge holding portion 203 is arranged at a position where the distance 221 is 8 μm or more, and an optical filter configured to block light with a wavelength of 750 nm or more is combined. If silicon is used as the substrate 201, the upper limit of the wavelength to be blocked by the optical filter can be set to about 1,130 nm that is the longest wavelength of light absorbable by silicon.

Figure 6:
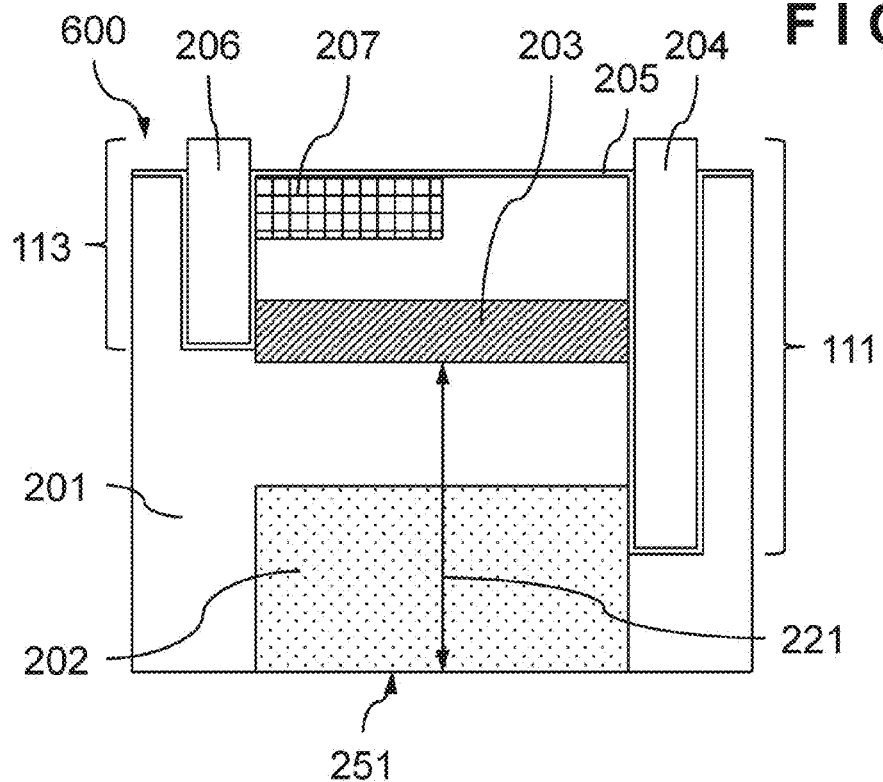
FIG. 6 is a sectional view of a solid-state image sensor according to another embodiment of the present invention.

The structure of a solid-state image sensor according to another embodiment of the present invention will be described with reference to FIGS. 6 and 7. FIG. 6 is a sectional view schematically showing an example of the arrangement of one pixel of a solid-state image sensor 600 according to a second embodiment of the present invention. In the solid-state image sensor 600 according to this embodiment, a second gate electrode 206 that forms a second transfer portion 113 is formed in a direction intersecting a light-receiving surface 251 of a substrate 201, as compared to the solid-state image sensor 200 according to the first embodiment. In this embodiment, the second gate electrode 206 has a vertical gate structure so as to form a channel to transfer signal charges in the vertical direction with respect to the light-receiving surface 251. Additionally, in the second embodiment, a charge holding portion 203 and a charge detection unit 207 are stacked in a direction intersecting the light-receiving surface 251, unlike the first embodiment in which they are arranged side by side in a direction parallel to the light-receiving surface 251. The remaining points can be the same as in the solid-state image sensor 200. Hence, a repetitive description of the same constituent elements as in the solid-state image sensor 200 will be omitted.

In the solid-state image sensor 600 according to this embodiment as well, the charge holding portion 203 is arranged while being spaced apart from the light-receiving surface 251 by a distance 221. Hence, the same light-shielding effect as in the above-described solid-state image sensor 200 can be obtained for the charge holding portion 203. In the solid-state image sensor 600 according to this embodiment, a charge accumulation portion 202, the charge holding portion 203, and the charge detection unit 207 are stacked in this order from the light-receiving surface 251 of the substrate 201. The p-n junction interface of the charge detection unit 207 on the side of the light-receiving surface 251 is located at a position deeper than the p-n junction interface of the charge holding portion 203 on the opposite side of the light-receiving surface 251. This can reduce the area of a pixel as compared to a case in which the charge holding portion 203 and the charge detection unit 207 are arranged side by side as in the solid-state image sensor 200, and a smaller solid-state image sensor is implemented.

Figure 7:
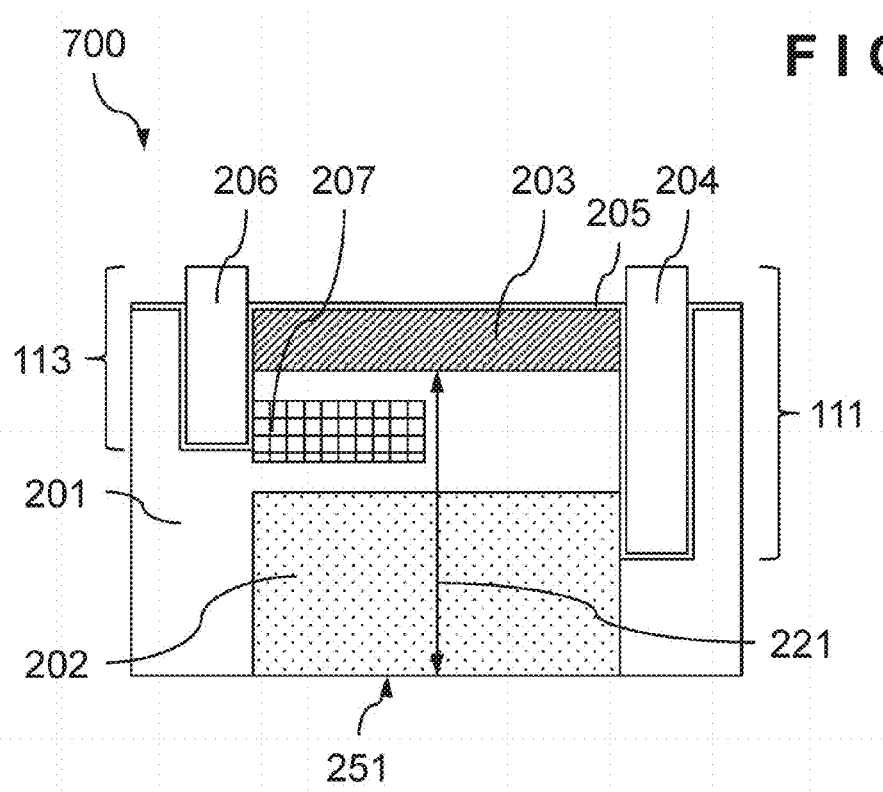
FIG. 7 is a sectional view showing a modification of the stacking order of a charge detection unit and a charge holding portion in the solid-state image sensor shown in FIG. 6.

As in a solid-state image sensor 700 shown in FIG. 7, the charge accumulation portion 202, the charge detection unit 207, and the charge holding portion 203 may be stacked in this order from the light-receiving surface 251 of the substrate 201. The p-n junction interface of the charge holding portion 203 on the side of the light-receiving surface 251 is located at a position deeper than the p-n junction interface of the charge detection unit 207 on the opposite side of the light-receiving surface 251. In general, the signal charge holding time of the charge detection unit 207 that constitutes the input node of a signal amplification unit is shorter than that of the charge holding portion 203. For this reason, as compared to the charge holding portion 203, the charge detection unit 207 is hardly affected by charges generated due to incident light during the time when transferred signal charges are temporarily held. The charge holding portion 203 that is readily affected by incident light is arranged at a position spaced apart from the light-receiving surface 251 by the distance 221, where the influence of incident light is reduced by absorption of light in the substrate 201. The charge detection unit 207 is arranged between the charge accumulation portion 202 and the charge holding portion 203. Accordingly, in the solid-state image sensor 700, the substrate 201 can be made thinner than in the solid-state image sensor 600. As a result, a solid-state image sensor whose profile is lower than the solid-state image sensor 600 is implemented.

Figure 8:
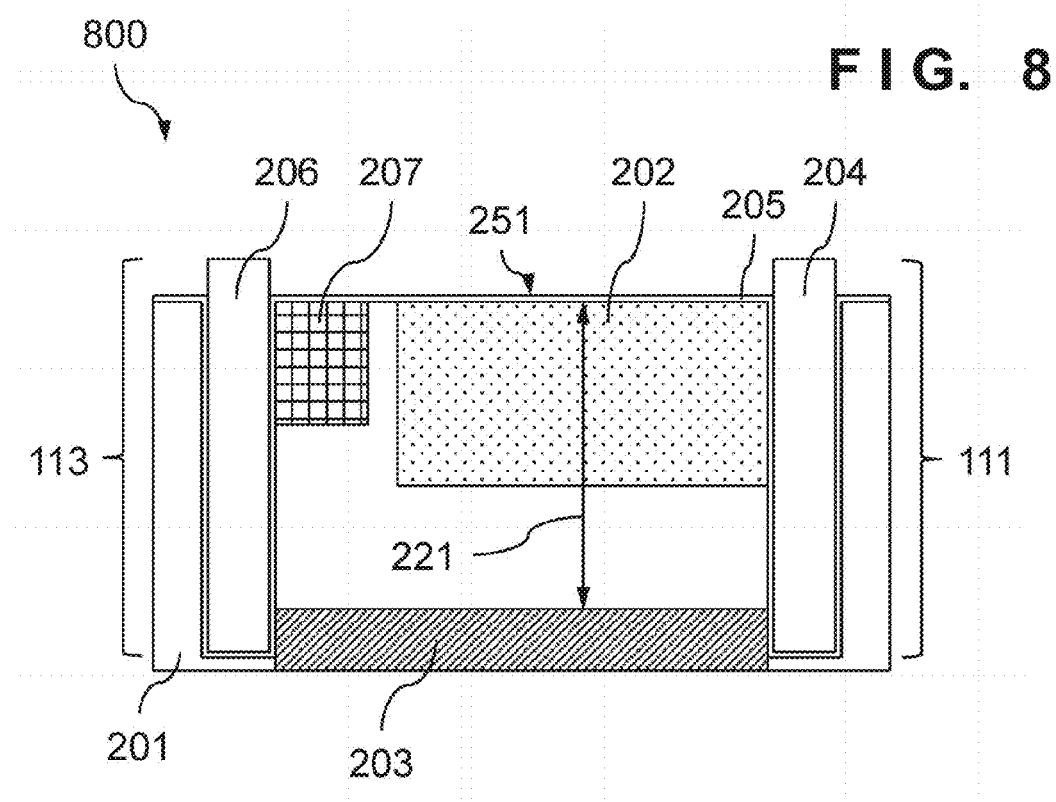
FIG. 8 is a sectional view of a solid-state image sensor according to still another embodiment of the present invention.

The structure of a solid-state image sensor according to still another embodiment of the present invention will be described with reference to FIG. 8. FIG. 8 is a sectional view schematically showing an example of the arrangement of one pixel of a solid-state image sensor 800 according to a third embodiment of the present invention. The solid-state image sensor 800 according to this embodiment is different from the solid-state image sensor 200 according to the first embodiment in that each of a first transfer portion 111 and a second transfer portion 113 uses a vertical gate structure. The solid-state image sensor 800 is also different from the solid-state image sensor 200 in that a charge accumulation portion 202 and a charge detection unit 207 are arranged side by side in a direction parallel to a light-receiving surface 251 of a substrate 201, and a charge holding portion 203 is arranged at a deep position from the light-receiving surface 251. The remaining points can be the same as in the solid-state image sensor 200. Hence, a repetitive description of the same constituent elements as in the solid-state image sensor 200 will be omitted.

In the solid-state image sensor 800 according to this embodiment, the charge accumulation portion 202 and the charge detection unit 207 can be formed on the same surface of the substrate 201. The solid-state image sensor 800 thus forms a front-side illumination solid-state image sensor, unlike the above-described solid-state image sensors 200 to 700 each of which forms a back-side illumination solid-state image sensor. In the solid-state image sensor 800 according to this embodiment as well, the charge holding portion 203 is arranged while being spaced apart from the light-receiving surface 251 by a distance 221. Hence, the same light-shielding effect as in the above-described solid-state image sensor 200 can be obtained for the charge holding portion 203. In the planar view of the light-receiving surface 251, the charge accumulation portion 202 and the charge detection unit 207 may be arranged at positions overlapping the charge holding portion 203. This arrangement implements downsizing of the solid-state image sensor.

Figure 9:
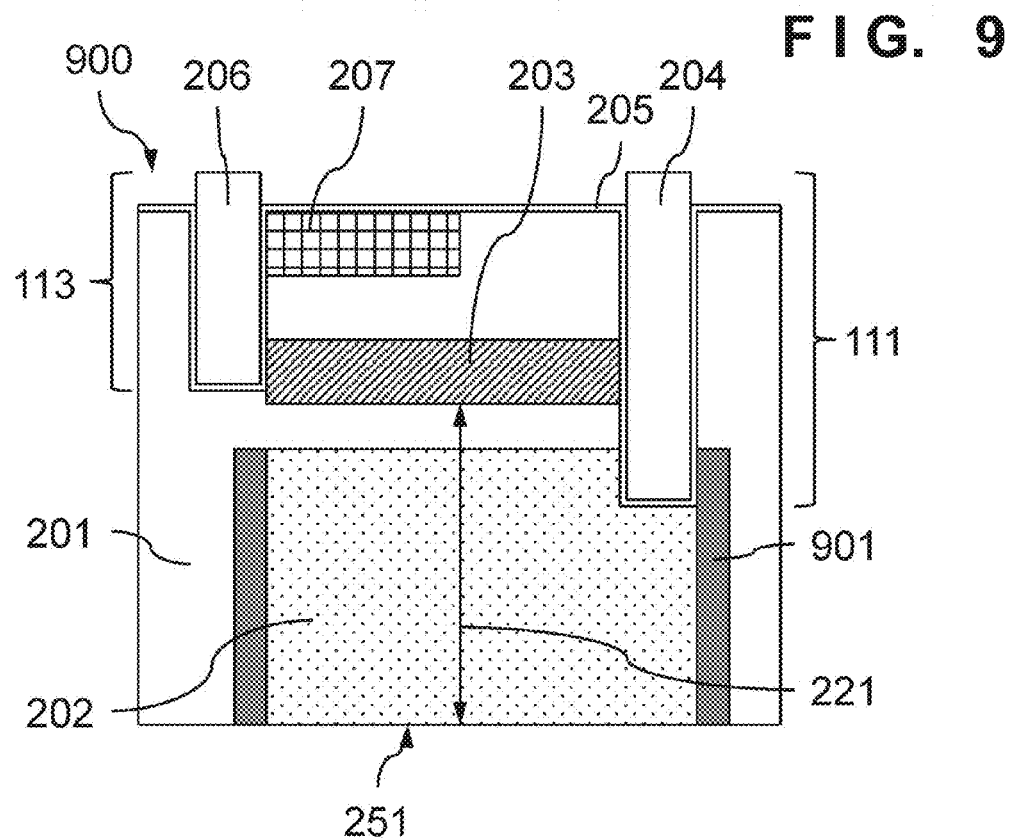
FIG. 9 is a sectional view of a solid-state image sensor according to yet another embodiment of the present invention.

The structure of a solid-state image sensor according to yet another embodiment of the present invention will be described with reference to FIG. 9. FIG. 9 is a sectional view schematically showing an example of the arrangement of one pixel of a solid-state image sensor 900 according to a fourth embodiment of the present invention. The solid-state image sensor 900 according to this embodiment is different from the solid-state image sensor 600 according to the second embodiment in that an element isolation layer 901 is arranged on the side surfaces of a charge accumulation portion 202. The remaining points can be the same as in the solid-state image sensor 600. Hence, a repetitive description of the same constituent elements as in the solid-state image sensor 600 will be omitted.

In the solid-state image sensor 900 according to this embodiment as well, a charge holding portion 203 is arranged while being spaced apart from a light-receiving surface 251 by a distance 221. Hence, the same light-shielding effect as in the above-described solid-state image sensor 600 can be obtained for the charge holding portion 203. Additionally, in this embodiment, crosstalk between adjacent pixels caused by light or signal charges can be suppressed by arranging the element isolation layer 901 on the side surfaces of the charge accumulation portion 202. This implements a solid-state image sensor having a higher S/N ratio.

Furthermore, since crosstalk between pixels can be suppressed, the charge accumulation portion 202 can be extended to a deeper position in a substrate 201. The distance to transfer signal charges from the charge accumulation portion 202 to the charge holding portion 203 can be shortened by thickening the charge accumulation portion 202. This can improve the transfer speed. In addition, charges generated by light with a longer wavelength can be collected, and the sensitivity can be improved accordingly.

The element isolation layer 901 is formed by embedding a dielectric material such as silicon oxide, a metal material such as aluminum, or an organic material in a trench provided in the substrate 201. The depth to form the element isolation layer 901 is appropriately decided. For example, if the element isolation layer 901 is formed to the same depth as the charge accumulation portion 202, crosstalk between adjacent pixels caused by light or signal charges can effectively be suppressed.

If the distance between the charge accumulation portion 202 and the charge holding portion 203 is short, punch-through may occur between the charge accumulation portion 202 and the charge holding portion 203. To prevent punch-through, a punch-through stopper may be provided in the region between the charge accumulation portion 202 and the charge holding portion 203.

Four embodiments of the present invention have been described above. However, the present invention is not limited to these embodiments. The above-described embodiments can appropriately be modified or combined. For example, in the second to fourth embodiments as well, the distance 221 to arrange the charge holding portion 203 apart from the light-receiving surface 251 of the substrate 201 or application of an optical filter or light-shielding layer can appropriately be set, as in the first embodiment.

As an application example of the solid-state image sensor according to each of the above embodiments, a camera incorporating the solid-state image sensor will be exemplarily described. The concept of the camera includes not only apparatuses mainly aiming at shooting but also apparatuses (for example, personal computer or portable terminal) having an auxiliary shooting function. The camera may be a module component such as a camera head. The camera includes the solid-state image sensor according to the present invention exemplified as the embodiment, and a signal processing unit that processes a signal output from the solid-state image sensor. The signal processing unit can include, for example, a processor that processes digital data based on the signal obtained by the solid-state image sensor. An A/D converter configured to generate the digital data can be provided on the semiconductor substrate of the solid-state image sensor or on another semiconductor substrate.

The solid-state image sensor is also applicable as a solid-state image sensor included in the video scope unit of an endoscope system. In particular, a monochrome-type solid-state image sensor can be applied to a color plane sequential-type endoscope that performs shooting while sequentially switching RGB monochromatic light as illumination light, and composites shot images to obtain a color image. This implements a high frame rate and solves problems such as color misregistration and flickering as compared to a conventional endoscope system including, for example, a CCD sensor as a solid-state image sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-240366, filed Nov. 27, 2014, which is hereby incorporated by reference wherein in its entirety.

What is claimed is:

1. A solid-state image sensor comprising:
   a substrate having a light-receiving surface;
   a charge accumulation portion that forms part of a photoelectric conversion element;

a charge holding portion and a charge detection unit which are arranged at positions deeper than the charge accumulation portion from the light-receiving surface;

a first transfer portion configured to transfer charges generated by the photoelectric conversion element to the charge holding portion along a depth direction of the substrate; and a second transfer portion configured to transfer the charges held by the charge holding portion to the charge detection unit, wherein in a planar view of the light-receiving surface, the charge detection unit is arranged at positions overlapping the charge holding portion, and in the depth direction of the substrate, the charge accumulation portion is arranged at a region shallower than a first depth from the light-receiving surface, either of the charge holding portion and the charge detection unit is arranged at a region deeper than a second depth from the light-receiving surface, and the other of the charge holding portion and the charge detection unit is arranged at the region between the first depth and the second depth.

2. The sensor according to claim 1, wherein the distance between the charge holding portion and the light-receiving surface is not less than 8 μm.

3. The sensor according to claim 1, further comprising a signal amplification unit configured to amplify a signal based on the potential of the charge detection unit and output the signal.

4. The sensor according to claim 1, wherein the depth of the charge detection unit from the light-receiving surface is greater than the depth of the charge holding portion from the light-receiving surface.

5. The sensor according to claim 1, wherein the charge detection unit is arranged at the depth from the light-receiving surface between the depth at which the charge accumulation portion is arranged and the depth at which the charge holding portion is arranged.

6. The sensor according to claim 3, wherein in a planar view of the light-receiving surface, the charge holding portion and the charge detection unit are arranged at positions overlapping the charge accumulation portion.

7. The sensor according to claim 1, wherein the first transfer portion transfers the charges in the vertical direction with respect to the light-receiving surface.

8. The sensor according to claim 1, wherein the second transfer portion transfers the charges in the vertical direction with respect to the light-receiving surface.

9. The sensor according to claim 1, further comprising, above the light-receiving surface, an optical filter configured to cover the charge accumulation portion.

10. The sensor according to claim 9, wherein the optical filter comprises an infrared cut filter.

11. The sensor according to claim 9, wherein the optical filter blocks light with a wavelength longer than a first wavelength, and light with a wavelength shorter than the first wavelength is absorbed by the substrate in a region from the light-receiving surface to the charge holding portion.

12. The sensor according to claim 1, wherein an element isolation layer is arranged on a side surface of the charge accumulation portion.

13. The sensor according to claim 1, wherein the substrate further comprises a light-shielding layer at a position overlapping the charge holding portion in a planar view of the light-receiving surface, the light-shielding layer being between the charge accumulation portion and the charge holding portion.

14. The sensor according to claim 1, further comprising, at a position overlapping the charge holding portion in a planar view of the light-receiving surface, a light-shielding layer configured to cover the light-receiving surface.

15. A camera comprising:
a solid-state image sensor according to claim 1; and
a signal processing unit configured to process a signal obtained by the solid-state image sensor.

16. The sensor according to claim 1, wherein a distance between the charge holding portion and the light-receiving surface is not less than 4 μm.

17. The sensor according to claim 1, further comprising an element isolation layer in contact with the first transfer portion.

18. A solid-state image sensor comprising:
a substrate having a light-receiving surface;
a charge accumulation portion that forms part of a photoelectric conversion element;
a charge holding portion arranged at a position deeper than the charge accumulation portion from the light-receiving surface;
a charge detection unit;
a first transfer portion configured to transfer charges generated by the photoelectric conversion element to the charge holding portion along a depth direction of the substrate; and
a second transfer portion configured to transfer the charges in the charge holding portion to the charge detection unit,
wherein the charge detection unit is arranged on a side of the light-receiving surface of the substrate.

19. The sensor according to claim 18, wherein in a planar view of the light-receiving surface, the charge accumulation portion and the charge detection unit are arranged at positions overlapping the charge holding portion.

20. The sensor according to claim 18, further comprising a signal amplification unit configured to amplify a signal based on the potential of the charge detection unit and output the signal.

21. The sensor according to claim 18, wherein in a planar view of the light-receiving surface, the charge detection unit is arranged at positions overlapping the charge holding portion.

22. The sensor according to claim 18, wherein the first transfer portion transfers the charges in the vertical direction with respect to the light-receiving surface.

23. The sensor according to claim 18, wherein the second transfer portion transfers the charges in the vertical direction with respect to the light-receiving surface.

24. The sensor according to claim 18, wherein an element isolation layer is arranged on a side surface of the charge accumulation portion.

25. The sensor according to claim 18, further comprising, at a position overlapping the charge holding portion in a planar view of the light-receiving surface, a light-shielding layer configured to cover the light-receiving surface.

26. A camera comprising:
a solid-state image sensor according to claim 18; and
a signal processing unit configured to process a signal obtained by the solid-state image sensor.

* * * * *